(12) United States Patent
Parker (10) Patent No.: US 8,842,477 B2
(45) Date of Patent: Sep. 23, 2014

(54) METHOD, APPARATUS, AND MANUFACTURE FOR FLASH MEMORY ADAPTIVE ALGORITHM

(75) Inventor: Allan Parker, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 69 days.

(21) Appl. No.: 13/486,972

(22) Filed: Jun. 1, 2012

(65) Prior Publication Data

US 2013/0322181 A1    Dec. 5, 2013

(51) Int. Cl.
*G11C 16/04* (2006.01)
(52) U.S. Cl.
USPC ............ 365/185.18; 365/185.29; 365/185.19
(58) Field of Classification Search
CPC ..... G11C 16/10; G11C 16/30; G11C 11/5628
USPC ........................ 365/185.19, 185.18, 185.29
See application file for complete search history.

(56) References Cited

U.S. PATENT DOCUMENTS

| | | | |
|---|---|---|---|
| 7,324,374 B2 | 1/2008 | Shieh et al. | |
| 8,116,137 B2 * | 2/2012 | Goda et al. | 365/185.17 |
| 8,194,458 B2 * | 6/2012 | Lee et al. | 365/185.19 |
| 8,456,912 B2 * | 6/2013 | Han et al. | 365/185.12 |
| 2008/0205137 A1 * | 8/2008 | Yanagidaira et al. | 365/185.03 |
| 2009/0027960 A1 | 1/2009 | Sarin et al. | |
| 2010/0165739 A1 | 7/2010 | Moschiano et al. | |
| 2010/0246262 A1 | 9/2010 | Lee | |
| 2011/0134702 A1 | 6/2011 | Imondi et al. | |
| 2012/0044769 A1 | 2/2012 | Yip | |

OTHER PUBLICATIONS

International Search Report and Written Opinion of the International Searching Authority for International Application No. PCT/US2013/042673, mailed Oct. 25, 2013.

* cited by examiner

*Primary Examiner* — Huan Hoang
(74) *Attorney, Agent, or Firm* — Sterne, Kessler, Goldstein & Fox P.L.L.C.

(57) ABSTRACT

A method, apparatus, and manufacture for a memory device is provided. The memory device includes a memory cell region including sectors, where each sector includes memory cells. The memory device further includes a memory controller that is configured to control program operations and erase operations to the memory cells. During erase operations to the memory cells, pre-programming occurs in which each unprogrammed memory cell in the sector being erased is programmed by applying at least one programming pulse at a program voltage until a program verify passes. Then, the program voltage is adjusted based on the number of programming pulses applied until the program-verify passed. During subsequent program operations in that sector, programming pulses are applied with the adjusted program voltage.

12 Claims, 4 Drawing Sheets

METHOD, APPARATUS, AND MANUFACTURE FOR FLASH MEMORY ADAPTIVE ALGORITHM

TECHNICAL FIELD

The invention is related to computer-readable memory, and in particular, but not exclusively, to a method, apparatus, and manufacture for an algorithm for flash memory erasing and programming in which the number of programming pulses required during the pre-programming phase of an erase operation may be used to adjust the program voltage used during subsequent program operations.

BACKGROUND

Various types of electronic memory have been developed in recent years. Some exemplary memory types are electrically erasable programmable read only memory (EEPROM) and electrically programmable read only memory (EPROM). EEPROM is easily erasable but lacks density in storage capacity, where as EPROM is inexpensive and denser but is not easily erased. "Flash" EEPROM, or Flash memory, combines the advantages of these two memory types. This type of memory is used in many electronic products, from large electronics like cars, industrial control systems, and etc. to small portable electronics such as laptop computers, portable music players, cell phones, and etc.

Flash memory is generally constructed of many memory cells where a single bit is held within each memory cell. Yet a more recent technology known as MirrorBit™ Flash memory doubles the density of conventional Flash memory by storing two physically distinct bits on opposite sides of a memory cell. The reading or writing of a bit occurs independently of the bit on the opposite side of the cell. A memory cell is constructed of bit lines formed in a semiconductor substrate. An oxide-nitride-oxide (ONO) dielectric layer formed over top of the substrate and bit lines. The nitride serves as the charge storage layer between two insulating layers. Word lines are then formed over top of the ONO layer perpendicular to the bit lines. Applying a voltage to the word line, acting as a control gate, along with an applied voltage to the bit line allows for the reading or writing of data from or to that location in the memory cell array. MirrorBit™ Flash memory may be applied to different types of flash memory, including NOR flash and NAND flash.

BRIEF DESCRIPTION OF THE DRAWINGS

Non-limiting and non-exhaustive embodiments of the present invention are described with reference to the following drawings, in which.

DETAILED DESCRIPTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "signal" means at least one current, voltage, charge, temperature, data, or other signal.

Briefly stated, the invention is related to a memory device that includes a memory cell region including sectors, where each sector includes memory cells. The memory device further includes a memory controller that is configured to control program operations and erase operations to the memory cells. During erase operations to the memory cells, pre-programming occurs in which each un-programmed memory cell in the sector being erased is programmed by applying at least one programming pulse at a program voltage until a program verify passes. Then, the program voltage is adjusted based on the number of programming pulses applied until the program-verify passed. During subsequent program operations in that sector, programming pulses are applied with the adjusted program voltage.

Figure 1:
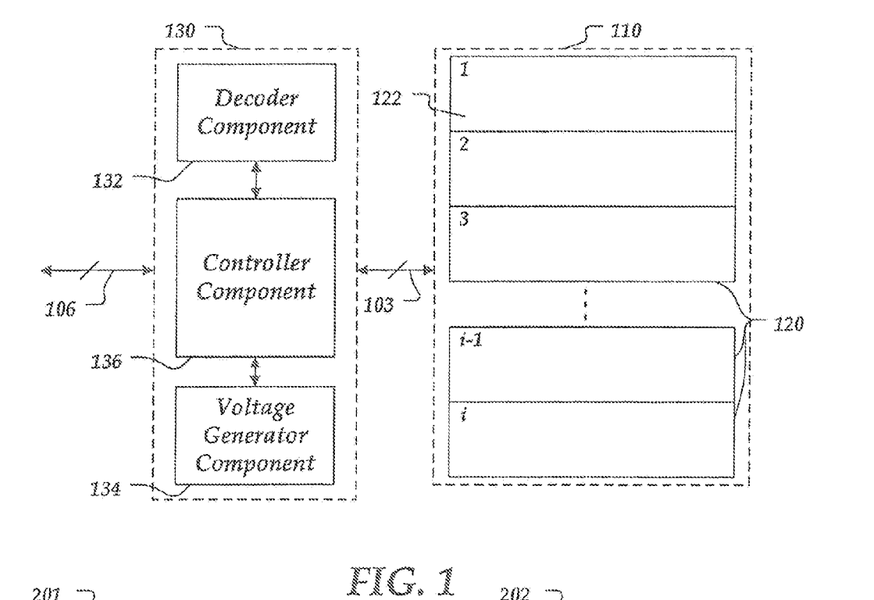
FIG. 1 illustrates a block diagram of an embodiment of a memory.

FIG. 1 shows a memory environment in which embodiments of the invention may be employed. Not all the components illustrated in the figures may be required to practice the invention, and variations in the arrangement and type of the components may be made without departing from the spirit or scope of the invention. For example, although some embodiments of the invention described in the context of a MirrorBit™ NOR flash memory, the fabrication described herein may be employed in manufacturing other types of microelectronic memories or devices such as other various types of flash memory.

As shown, memory 100 includes arrayed memory 110 and memory controller 130. Memory controller 130 is arranged to communicate addressing data and program data over signal path 106. For example, signal path 106 can provide 8, 16, or more I/O lines of data. Memory controller 130 is also configured to access arrayed memory 110 over signal path 103. For example, memory controller 130 can read, write, erase, and perform other operations at portions of arrayed memory 110 via signal path 103. In addition, although shown as single lines, signal path 103 and/or signal path 106 may be distributed across a plurality of signal lines and/or bus lines.

Arrayed memory 110 includes memory sectors 120 (identified individually as sectors 1-i) that can be accessed via memory controller 130. Memory sectors 120 can include, for example, 256, 512, 1024, 2048 or more sectors having memory cells that can be individually or collectively accessed. In other examples, the number and/or arrangement of memory sectors can be different. In one embodiment, for example, sectors 120 can be referred to more generally as memory blocks and/or can be configured to have a configuration that is different than a bit line, word line, and/or sector topology.

Memory controller 130 includes decoder component 132, voltage generator component 134, and controller component 136. In one embodiment, memory controller 130 may be located on the same chip as arrayed memory 110. In another embodiment, memory controller 130 may be located on a different chip, or portions of memory controller 130 may be located on another chip or off chip. For example, decoder component 132, controller component 134, and voltage generator component 136 can be located on different chips but co-located on the same circuit board. In other examples, other implementations of memory controller 130 are possible. For example, memory controller 130 can include a programmable microcontroller.

Decoder component 132 is arranged to receive memory addresses via addressing signal path 106 and to select individual sectors, arrays, or cells according to the architecture of arrayed memory 110.

Decoder component 132 includes, for example, multiplexer circuits, amplifier circuits, combinational logic, or the like for selecting sectors, arrays, and/or cells based on any of a variety of addressing schemes. For example, a portion of a memory address (or a grouping of hits) can identify a sector within arrayed memory 110 and another portion (or another grouping of bits) can identify a core cell array within a particular sector.

Voltage generator component 134 is arranged to receive one or more supply voltages (not shown) and to provide a variety of reference voltages required for reading, writing, erasing, pre-programming, soft programming, and/or under-erase verifying operations. For example, voltage generator component 134 can include one or more cascode circuits, amplifier circuits, regulator circuits, and/or switch circuits that can be controlled by controller component 136.

Controller component 136 is arranged to coordinate reading, writing, erasing, and other operations of memory 100. In one embodiment, controller component 136 is arranged to receive and transmit data from an upstream system controller (not shown). Such a system controller can include, for example, a processor and a static random access memory (SRAM) that can be loaded with executable processor instructions for communicating over signal path 106. In another embodiment, controller component 136 as well as other portions of memory controller 130 may be embedded or otherwise incorporated into a system controller or a portion of a system controller. The memory controller may include a processor-readable medium having processor-executable code encoded therein, which when executed by one or more processors in memory controller 130, enables actions.

Embodiments of controller component 136 can include a state machine and/or comparator circuits. State machine and comparator circuits can include any of a variety of circuits for invoking any of a myriad of algorithms for performing reading, writing, erasing, or other operations of memory 100. State machines and comparator circuits can also include, for example, comparators, amplifier circuits, sense amplifiers, combinational logic, or the like.

In some embodiments, memory 100 is a flash-based memory including flash-based memory cells, such as flash-based NAND cells, NOR cells, or hybrids of the two. Memory controller 130 is arranged to perform erase and program operations in an adaptive manner that adapts for changing program performance over time so that good read margin bit distribution is maintained.

Figure 2:
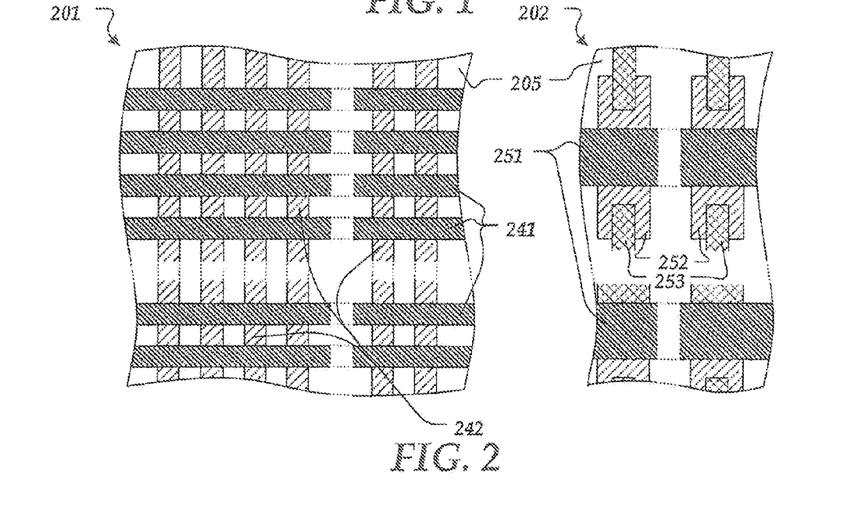
FIG. 2 shows a partial top plan view of an embodiment of core and peripheral sections of a memory that may be employed in the memory of FIG. 1.

FIG. 2 shows a partial top plan view of separate sections of a memory. Core section 201, for example, may be an embodiment of a portion of sector 120 of FIG. 1 and may include arrayed core memory cells. Peripheral section 202, for example, may be an embodiment of memory controller 110 of FIG. 1 or a portion of memory controller 110 of FIG. 1.

Core section 201 includes core polysilicon lines 241, conductive regions 242, and a portion of substrate 205. Portions of core polysilicon lines 241 are coupled to the gates of individual memory cells (not shown in FIG. 2) and can be configured as a word line, a source select gate line, and/or a drain select gate line. Portions of conductive regions 242 can include, for example, p-type and/or n-type doped regions of substrate 205 for forming source/drain regions and/or conductive lines. For example, conductive regions 242 can form portions of bit lines and/or other signal lines. Also, in some embodiments, individual conductive regions 242 extend at least partially underneath individual core polysilicon lines 241.

In one embodiment, core section 201 is arranged in a NOR topology, and individual memory cells can be individually accessed via individual conductive regions 242. In another embodiment, core section 201 is arranged in a NAND topology, and individual memory cells can be accessed though individual conductive regions 242 collectively but not individually. In other embodiments, hybrid architectures can be employed. For example, core section 201 can be configured to have a portion that is NAND-based and another portion that is NOR-based. Also, although not shown in FIG. 2, core section 201 may include any of a variety of interconnect and/or passivation layers, such as dielectric, conductive, or other layers. For example, conductive regions 242 can be positioned beneath a dielectric spacer layer.

Peripheral section 202 includes peripheral polysilicon lines 251, conductive regions 252, and interconnects 253. Portions of peripheral polysilicon lines 251 are coupled to individual peripheral devices (not shown in FIG. 2).

Portions of conductive regions 252 can include, for example, p-type and/or n-type doped regions of substrate 205 for forming conductive features, such as a source, a drain, or other type of well. Interconnects 253 can include conductive lines that electrically intercouple portions of peripheral section 202 and/or electrically couple core section 201 with peripheral section 202. For example, interconnects 253 can include a combination of metal lines and vias. Also, although not shown in FIG. 2, peripheral section 202 may also include any of a variety of other interconnect and/or passivation layers.

Figure 3:
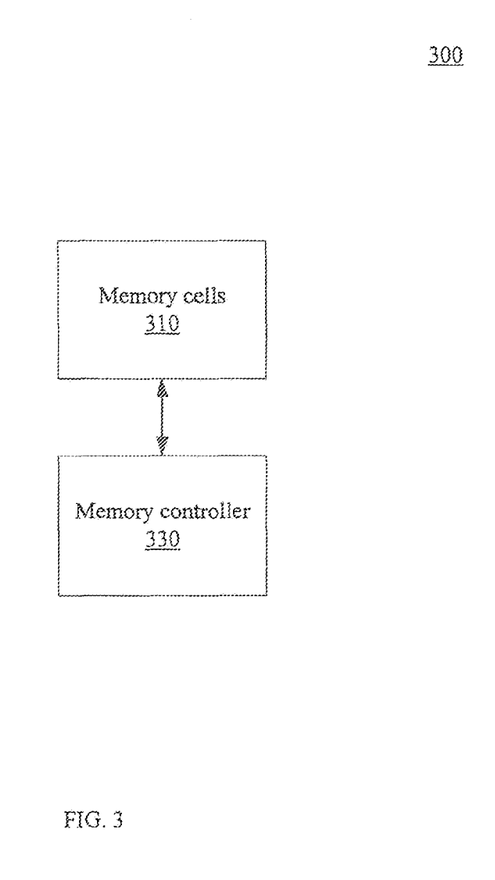
FIG. 3 illustrates a block diagram of an embodiment of the memory device of FIG. 1.

FIG. 3 illustrates a block diagram of an embodiment of memory device 300. Memory device 300 includes memory controller 330 and memory cells 310.

Memory cells 310 may include, for example, a memory cell region including sectors, where each sector includes memory cells. Memory controller 330 is configured to control program operations and erase operations to memory cells 310. When memory controller 330 performs erase operation to memory cells 310, the erase operation includes a programming phase that occurs prior to the actual erase. This programming phase that occurs within the erase operation may be referred to as "pre-programming".

During the pre-programming, at least one programming pulse is applied at a program voltage to each memory cell in the sector that is being erased until a program verify passed. The number of programming pulses applied (until the program verify passed) is stored. The program voltage is then adjusted based on the number of programming pulses applied until the program verify passed. During programming operation subsequent to the erase operation, programming pulses are applied to each bit to be programmed, in which the most recent adjusted program voltage is used.

Figure 4:
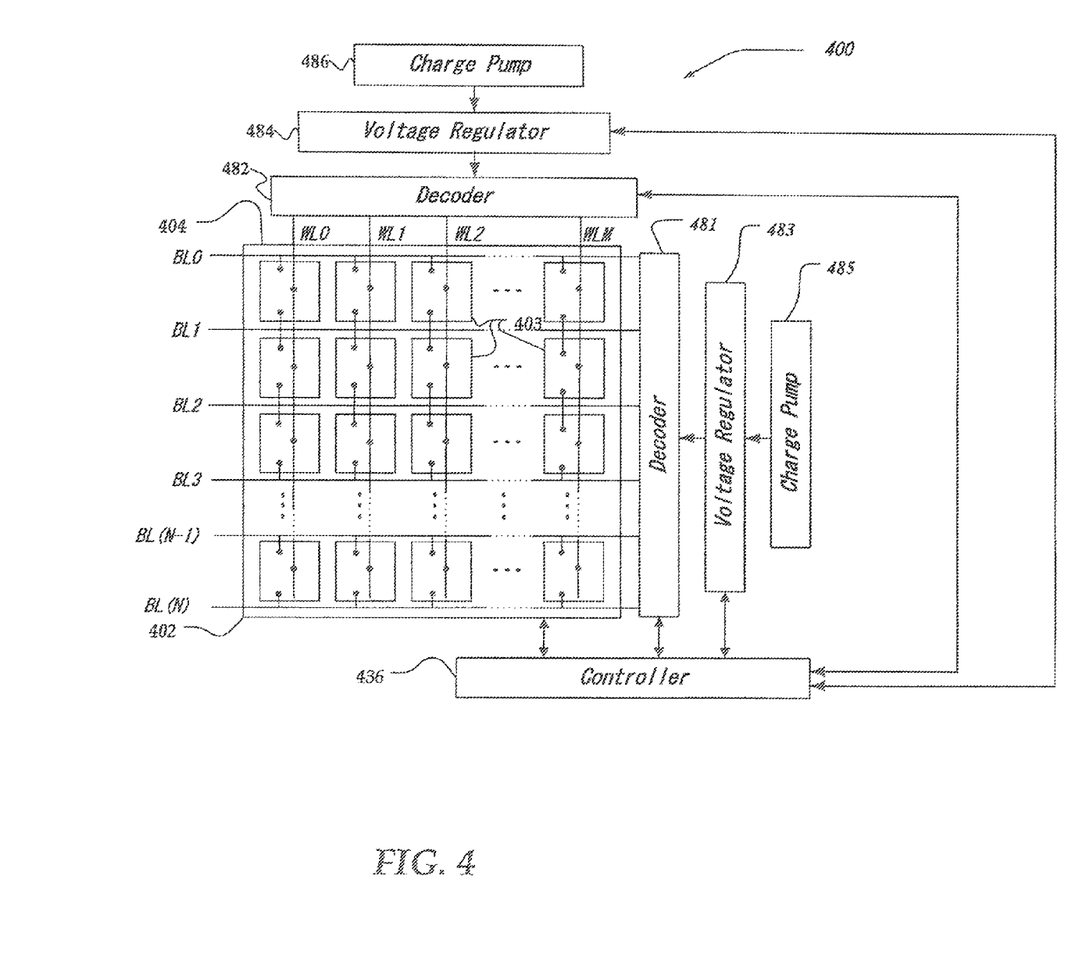
FIG. 4 shows a block diagram of an embodiment of the memory device of FIG. 1 or FIG. 3.

FIG. 4 illustrates a block diagram of an embodiment of memory device 400, which may be employed as an embodiment of memory device 300 of FIG. 3. Memory device 400 includes memory array 402 and individual memory cells 403 located within memory array 402. Memory cells 403 are arranged in N+1 rows and M+1 columns in memory array 402. In one embodiment, each row of memory array 402 is accessed by two of the bit lines BL0 to BLN. Each column of memory array 402 is accessed by one of word lines WL0 to WLM. Accordingly, each of memory cells 403 can be accessed by activating the corresponding bit lines and a corresponding word line of the cell. In one embodiment, each column of memory array 402 defines a data word. If N+1 has a value of 8, for example, the cells in each column of memory array 402 define a byte of data.

Memory cells 403 may be flash memory cells which store bits in different ways in different embodiments. In various embodiments, a single cell may store one or more bits. For example, some memory cells are single cell devices, some memory cells are dual cells devices, and in some embodiments, more than one distinct level of threshold voltage may be used to represent more than one bit per cells, as discussed in greater detail below. In some embodiments, flash memory stores information in an array of memory cells made from floating-gate transistors. In, for example, a NOR gate flash, the transistors resemble a standard metal-oxide-semiconductor field-effect transistor ("MOSFET") except that the transistor has two gates, a floating gate and a control gate, instead of one. On top is the control gate ("CG"), as in other metal-oxide-semiconductor transistors, but below this there is a floating gate ("FG") insulated all around by an oxide layer. The FG is interposed between the CG and the MOSFET channel. Because the FG is electrically isolated by an insulating layer, any electrons placed on it are trapped there and, under normal conditions, will not discharge for many years. When the FG holds a charge, it screens (partially cancels) the electric field from the CG, which modifies the threshold voltage ("$V_T$") of the cell. The threshold voltage of a MOSFET is usually defined as the gate voltage where an inversion layer forms at the interface between the insulating layer (oxide) and the substrate (body) of the transistor. During read-out, a voltage is applied to the CG, and the MOSFET channel will become conducting or remain insulating, depending on the $V_T$ of the cell, which is in turn controlled by the charge on the FG. The current flow through the MOSFET channel is sensed which permits a determination of the voltage threshold for the device, which in turn provides information about the binary data stored within the device.

In a single cell device, each control gate of a transistor stores a single charge amount that represents the stored information. In its default or "un-programmed" state, it is logically equivalent to a binary "1" value, because current will flow through the channel under application of an appropriate voltage to the control gate.

In a dual cell device, each control gate stores two charge amounts that represent the stored information. That is, two physically distinct quantities of charge are stored on opposite sides of the floating gate. Reading or writing data on one side of the floating gate occurs independently of the data that is stored on the opposite side of the floating gate. In this technology, the FG is split into two mirrored or complementary parts, each of which is formulated for storing independent information. Each dual cell, like a traditional cell, has a gate with a source and a drain. However, in the dual cell the connections to the source and drain may be reversed in operation to permit the storage of the two bits. Each of the memory cells is comprised of multi-layers. A charge-trapping dielectric layer is formed over a semiconductor substrate. The charge-trapping dielectric layer can generally be composed of three separate layers: a first insulating layer, a charge-trapping layer, and a second insulating layer. Word-lines are formed over the charge-trapping dielectric layer substantially perpendicular to the bit lines. Programming circuitry controls two bits per cell by applying a signal to the word-line which acts as a control gate, and changing bit line connections such that one bit is stored by the source and drain being connected in one arrangement and the complementary bit is stored by the source and drain being connected in another arrangement.

In a single-level cell ("SLC") device, each cell stores only one bit of information, either the cell is "un-programmed" (has a "1" value) or "programmed" (has a "0" value). There also exist multi-level cell ("MLC") devices that can store more than one bit per cell by choosing between multiple levels of electrical charge to apply to the floating gates of its cells. In these devices, the amount of current flow is sensed (rather than simply its presence or absence), to determine more precisely the level of charge on the FG.

As an example, a dual cell device may also be a MLC device that stores four-bits-per-cell so that one transistor equates to 16 different states. This enables greater capacity, smaller die sizes and lower costs for the flash devices.

Memory device 400 further includes temperature-sensing device 461, controller 436, decoder 481, decoder 482, voltage regulator 483, voltage regulator 484, charge pump 485, and charge pump 486.

Charge pump 485 is arranged to provide a boosted bit line voltage. Charge pump 486 is arranged to provide a boosted word line voltage. Voltage regulator 483 is arranged to receive the boosted voltage from charge pump 485, and to provide an adjusted boosted bit line voltage based on control from controller 436. Similarly, voltage regulator 484 is arranged to receive the boosted voltage from charge pump 486, and to provide an adjusted boosted word line voltage based on control from controller 436.

Decoder 481 and decoder 482 can each receive address bus information from controller 436 and can utilize such information to facilitate accessing or selecting the desired memory cell(s) (e.g., memory location(s)) associated with the command, and to provide the needed voltages to the bit lines (decoder 481) and the word lines (decoder 482) according to timing that is controlled by controller 436.

Decoder 481 may also include a sector decoder in some embodiments. As such, decoder 409 may be arranged to facilitate accessing or selection particular column or grouping of columns within memory device 400. For example, a grouping of columns may define a sector, and another grouping of columns may define another sector. In another embodiment, portion 401 may include an array decoder to a particular memory array 404. In addition, embodiments of array decoders can be configured to work separately or in conjunction with a sector decoder.

Memory controller 436 is also configured to control the activation and de-activation individual word lines WL0 to WLM for reading, writing, and/or erasing to memory array 402. For example, memory controller 410 can provide a select signal to decoder 482 to select one of the columns WL1 to WLM to activate that column. Further, memory controller 436 can provide a select signal to decoder 481 for selecting particular rows BL0 to BLN (or sector) to be written to or read from. A read operation is used to read the value of a stored bit but does not alter the bit. A program operation is a bit-altering operation that changes a bit from an un-programmed value to a programmed value. An erase operation is a bit-altering operation that changes a bit from a programmed value to an un-programmed value.

In one embodiment, program operations to a particular memory cell 403 are performed as follows. Controller 436 is arranged to cause a boosted voltage provided by voltage regulator 481 to be coupled to the appropriate bit line for the memory cell, and to cause a boosted voltage provided by voltage regulator 484 to be coupled to the appropriate word line for the memory cell. These voltages are provided to the memory cell 403 for a particular period of time. In some embodiments, the pulse duration is on the order of 100 to 200 ns. At a time after the pulse is complete, a program-verify is performed to determine whether or not the threshold voltage of the cell has reached the appropriate voltage to be a programmed bit. If so, the programming of the bit is complete. If not, similar repeated pulses are performed, until either a program-verify is successful, or the operation times out.

In some embodiments, a bit is stored on both the left side and the right side of each memory cell. In some of these embodiments, during programming operations, for each programming pass, a programming pass occurs to the left sides of the memory cells first, and the right sides subsequently. As memory controller 403 is controlling performance of programming of the left side bits, for each left-side bit that is being programmed, the boosted word line voltage is applied to the control gate of the memory cell, the boosted bit line voltage is applied to the left side of the memory cell, and the right side of the memory cell is grounded. In some embodiments, the boosted word line voltage is applied prior to the boosted bit line voltage. However, application of the word line voltage, by itself, has little effect on the programming of the cell. After the word line voltage is applied to the memory cell, the bit line voltage is applied. In some embodiments, the boosted word line voltage is about 8 or 9 volts, and the boosted bit line voltage is about 5 volts. When both the boosted word line voltage and the boosted bit line voltage are applied to the memory cell, it is the beginning of the programming pulse.

In those embodiments, after the left side bits to be programmed receive programming pulses, the right side bits to be programmed receive programming pulses in substantially the same way, with the difference being that, for each right-side bit that is to be programmed, the right side of the cell received the boosted bit line voltage, and the left side of the cell is grounded.

In those embodiments, after programming pulses are applied to both sides of the memory sides, if not all of the cells to be programmed are successfully programmed yet, similar repeated pulses are performed (again, with alternating left-side and right side passes), until either a program-verify is successful, or the operation times out.

Embodiments of memory device 400 maintain a good read margin over the life of memory device 400 by maintaining tight VT distributions over the lifetime of memory device 400. Each memory device 400 has a VCC window, a temperature window, and a lifetime of device window that it must be operative over. If the read margin becomes too small as a result of these factors, a bit may be read incorrectly.

In some embodiments of memory device 400, the program performance of memory device 400 over the age of the part is a "bathtub curve". At beginning of life (BOL), there is a particular program performance, and as the device ages, the memory cells become significantly easier to program. Then the program performance will stay fairly constant for a relatively long period of time, until, near the end of life (EOL), the speed at which the bits can be programmed starts to slow down again. If memory device 400 were tuned for program performance at BOL and for that program performance acceptable read margins are achieved, as memory device 400 cycles and ages, without applying the adaptive adjustments, the read margin would degrade. Some embodiments of memory device 400 apply adaptive adjustments that track the program performance of memory device 400 over the age of the part, so that the read margin is maintained.

In some embodiments of memory device 400, erase operations are performed on a sector-by-sector basis. At the beginning of the erase operation, a bulk programming operation is performed on the sector, programming each un-programmed bit in the sector to ensure that each bit in the sector is in the programmed state after the bulk programming operation is completed. This bulk programming phase that occurs as part of the erase operation may be referred to as "pre-programming". After the pre-programming, controller 436 controls performance of the erase operation to cause each of the bits in the sector being erased to change from the programmed state to the un-programmed state.

During the pre-programming, some of the bits are being changed from the un-programmed state to the programmed state, and pulses are applied until a program verify is passed as discussed above. The number of pulses applied in that sector is stored.

The stored number of pulses for that sector is used in later programming operations for that sector. This stored number is used to adjust subsequent programming operations to adjust the program voltage, if needed. The "program voltage" is generally the boosted word line voltage applied to the memory cell, although it may be the bit line voltage in some embodiments. Changing the program voltage changes the programming speed.

For each memory device 400, there is an optimal number of programming pulses to be applied. If a bit becomes programmed after a relatively small number of programming pulses, such as only one or two programming pulses, then the read margin will decrease. The stored number of pulses required during the last pre-programming phase is used to adjust the program voltage used in subsequent program operations. If less that than the optimum number of pulses was needed until the program verify passed, then programming occurred too fast, so the program voltage is decreased. If more than the optimum number of pulses was needed until the program verify passed, then programming occurred too slowly, so that the program voltage is increased. If exactly the optimum number of pulses is used, the program voltage remains unchanged. For example, a program voltage may be 9.5 V at BOL, may be gradually decreased over the age of the device to about 8.5 V, and increased again near the EOL of memory device 400. In each case, the changes are based on the stored number of pulses required for program verify during the pre-programming phase of the last erase operation. In some embodiments, the initial value used before the first erase operation is factory-tuned.

In some embodiments, at the time near the EOL when the program voltage returns to a value near its starting value at the BOL, this may be used to signal a warning or indication to the user that the EOL is near and that the device should be replaced soon.

In some embodiments, memory device 400 is monolithic, and all of the devices illustrated in FIG. 4 are located together on the same chip. In other embodiments, some of the components illustrated in FIG. 4 may be located on a different chip, or portions of the devices may be located on a different chip. Some of the devices may be located on different chips but co-located on the same circuit board.

In some embodiments of memory device 400, erase operations are performed on a sector-by-sector basis, while programming and pre-programming operations are performed as bitwise operations. As stated above, "During the pre-programming, some of the bits are being changed from the unprogrammed state to the programmed state, and pulses are applied until a program verify is passed as discussed above. The number of pulses applied in that sector is stored. The stored number of pulses for that sector is used in later programming operations for that sector." Since the pre-programming is a bitwise operation, the number of pulses stored for the sector could be different in different embodiments. In some embodiments, the fastest and slowest bits are tracked. In some embodiments, the adjustment matches the bathtub curve, so that, on the way down the bathtub curve, if the fastest bits are too fast, the program voltage is reduced for the next program. On the way up the bathtub curve, if the slowest bits are too slow, the program voltage is adjusted up. Tracking just the min and max pulse counts of a full sector allows for this adjustments. Accordingly, in some embodiments, "the number of pulses applied in that sector is stored" means that the min and max pulse counts (for all bits in the sector) are stored. This may be done in other ways in other embodiments.

Modern semiconductor devices are typically created as integrated circuits manufactured on the surface of a substrate of semiconductor material. The processing begins by growing a wafer, which is typically done using the Czochralski process. Various devices are formed on the wafer using a series of steps that include deposition, removal processes (such as etching), patterning, and doping. Few steps or many hundreds of such steps may be used in various designs. The patterning steps may be performed by photolithography or other lithographic methods. For example, the wafer may be coated with a photoresist, which is exposed with a device that exposes light through photomasking, exposing portions of the wafer not blocked by the photomask to light. The exposed regions are removed so that the photoresist remains only in areas that were not exposed to light. This allows a layer to be etched according to the pattern on the photomask. After the devices have been formed on the wafer, various back-end processing and packaging is performed, including properly interconnecting the devices and bringing metal lines to the chip edge for attachment to wires.

A designer creates the device design in accordance with a set of design rules provided by the fabricator, and creates a series of design files based on the design. Various design tools may be used by the designer in creating the design, simulating the design, and checking the design for layout rules violations. When completed, the design files are provided to the fabricator, which are used to generate photomasks for use in fabricating the device. The design files may be communicated in different ways, including over a network.

Figure 5:
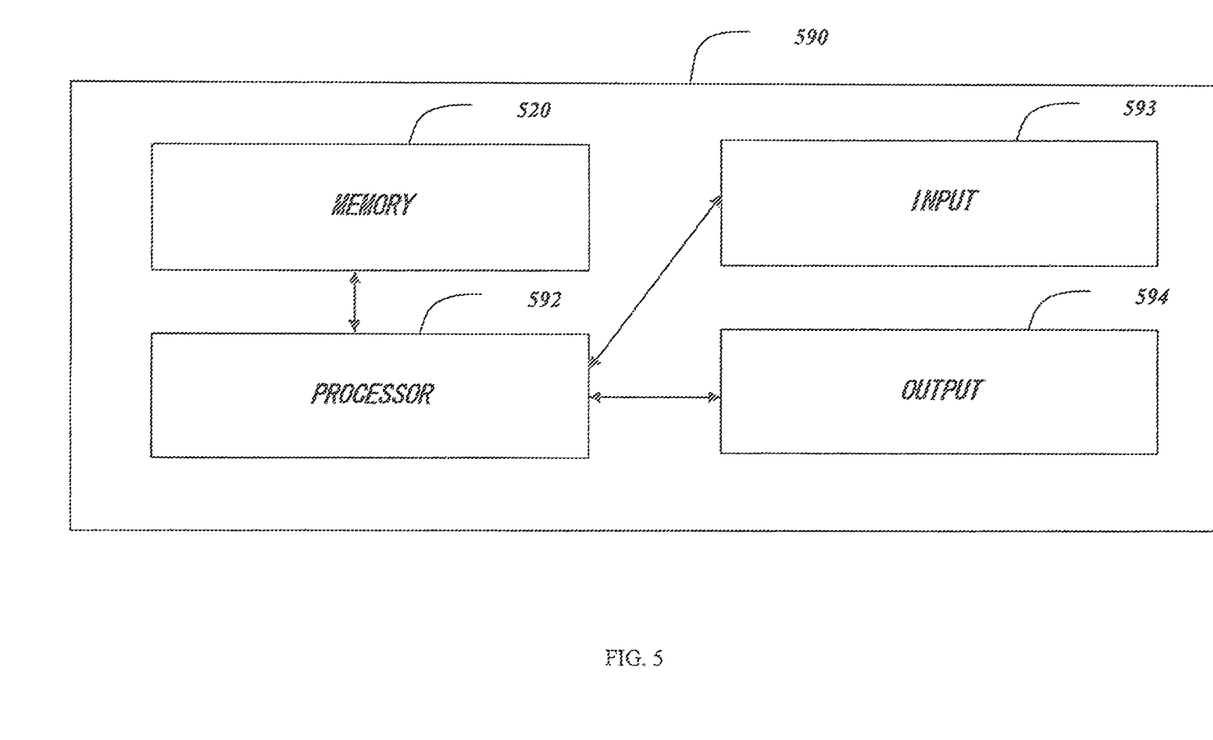
FIG. 5 illustrates a block diagram of an embodiment of a system that includes the memory device of FIG. 4, in accordance with aspects of the invention.

Embodiments of memory device 400 of FIG. 4 can be incorporated into any of a variety of components and/or systems, including for example, a processor and other components or systems of such components. FIG. 5 shows one embodiment of system 590, which may incorporate memory 520, which is an embodiment of memory device 400 of FIG. 4. Memory 520 can be directly or indirectly connected to any one of processor 592, input devices 593, and/or output devices 594. In one embodiment, memory 520 may be configured such that it is removable from system 590. In another embodiment, memory 520 may be permanently connected to the components or a portion of the components of system 590.

In many embodiments, memory 520, processor 592, input devices 593, and/or output devices 594 of system 590 are configured in combination to function as part of a larger system. For example, system 590 may be incorporated into a cell phone, a handheld device, a laptop computer, a personal computer, and/or a server device. In addition or alternatively, system 590 can perform any of a variety of processing, controller, and/or data storage functions, such as those associated with sensing, imaging, computing, or other functions. Accordingly, system 590 can be incorporated into any of a wide variety of devices that may employ such functions (e.g., a digital camera, an MP3 player, a GPS unit, and so on).

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A memory device, comprising:
   a memory cell region including a sector; and
   a memory controller that is configured to:
      during an erase operation, apply one or more first programming pulses to a first memory cell of the sector such that a state of the first memory cell changes to a first state, and, subsequently, to control all memory cells in the sector to transition from the first state to a second state; and
      during a program operation, apply a second programming pulse to a second memory cell of the sector to transition the second memory cell to the first state,
   wherein the memory controller is configured to determine a voltage of the second programming pulse based on a number of the one or more first programming pulses.

2. The memory device of claim 1, wherein the memory controller is configured to decrease the voltage of the second programming pulse if the number of the one or more first programming pulses is less than a pre-determined target number of programming pulses.

3. The memory device of claim 1, wherein the memory controller is configured to increase the voltage of the second programming pulse if the number of the one or more first programming pulses is greater than a pre-determined target number of programming pulses.

4. The memory device of claim 1, wherein the memory controller is configured to:
   decrease the voltage of the second programming pulse if the number of the one or more first programming pulses is less than a pre-determined target number of programming pulses, and
   increase the voltage of the second programming pulse if the number of the one or more first programming pulses is greater than the pre-determined target number of programming pulses.

5. The memory device of claim 1, wherein the voltage of the second programming pulse is one of a word line voltage or a bit line voltage.

6. The memory device of claim 1, wherein each memory cell in the memory cell region is a flash memory cell.

7. The memory device of claim 1, wherein the memory controller is configured to monitor changes in the voltage of the second programming pulse over time, and to provide an end-of-life warning indication when the voltage of the second programming pulse returns to a value near an initial value of the voltage of the second programming pulse after the voltage of the second programming pulse has decreased from the initial value.

8. The memory device of claim 1, wherein each memory cell in the sector is configured to store at least one bit.

9. The memory device of claim 1, wherein the memory controller is configured to apply respective one or more first pulses to each memory cell of the sector and to store a minimum number of the one or more first pulses needed to transition a respective memory cell to the first state, wherein the memory controller is configured to determine the voltage of the second programming pulse based on the minimum number of one or more first pulses.

10. The memory device of claim 1, wherein the memory controller is configured to apply respective one or more first pulses to each memory cell of the sector and to store a maximum number of the one or more first pulses needed to transition a respective memory cell to the first state, wherein the memory controller is configured to determine the voltage of the second programming pulse based on the maximum number of one or more first pulses.

11. A method, comprising:
    erasing a sector of a memory cell region of a memory device, comprising:
        applying, to a first memory cell in the sector, one or more first programming pulses until a state of the first memory cell changes to a first state;
        storing a number of the one or more first programming pulses; and
        controlling all memory cells of the sector to transition from the first state to a second state;
    determining a voltage of a second programming pulse based on the number of the one or more first programming pulses; and
    applying the second programming pulse to a second memory cell of the sector to transition the second memory cell from the second state to the first state.

12. A manufacture including a processor-readable medium having processor-executable code encoded therein, which when executed by one or more processors, enables actions, comprising:
    erasing a sector of a memory cell region of a memory device, comprising:
        applying, to a first memory cell in the sector, one or more first programming pulses at a program voltage until a state of the first memory cell changes to a first state;
        storing a number of the at least one first programming pulses; and
    determining a voltage of a second programming pulse based on the number of the one or more first programming pulses; and
    applying the second programming pulse to a second memory cell of the sector to transition the second memory cell from the second state to the first state.

* * * * *